(12) United States Patent
Hassner et al.

(10) Patent No.: US 8,201,061 B2
(45) Date of Patent: Jun. 12, 2012

(54) DECODING ERROR CORRECTION CODES USING A MODULAR SINGLE RECURSION IMPLEMENTATION

(75) Inventors: Martin Hassner, Mountain View, CA (US); Kirk Hwang, Palo Alto, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 881 days.

(21) Appl. No.: 12/270,737

(22) Filed: Nov. 13, 2008

(65) Prior Publication Data

US 2009/0063938 A1 Mar. 5, 2009

Related U.S. Application Data

(62) Division of application No. 11/207,474, filed on Aug. 18, 2005, now Pat. No. 7,467,346.

(51) Int. Cl.
*H03M 13/00* (2006.01)
(52) U.S. Cl. .......................... 714/785; 714/781
(58) Field of Classification Search .......... 714/785, 714/781
See application file for complete search history.

(56) References Cited

U.S. PATENT DOCUMENTS

| | | | |
|---|---|---|---|
| 4,694,455 A * | 9/1987 | Koga | 714/782 |
| 5,428,628 A | 6/1995 | Hassner et al. | |
| 5,502,665 A | 3/1996 | Im | |
| 5,812,438 A | 9/1998 | Lan et al. | |
| 6,061,826 A * | 5/2000 | Thirumoorthy et al. | 714/784 |
| 6,092,233 A | 7/2000 | Yang | |
| 6,122,766 A | 9/2000 | Fukuoka et al. | |
| 6,343,305 B1 | 1/2002 | Koc et al. | |
| 7,170,948 B2 * | 1/2007 | Berthet et al. | 375/267 |
| 2004/0078408 A1 | 4/2004 | Miller et al. | |

OTHER PUBLICATIONS

Dilip V. Sarwate, et al., "High-Speed Architectures for Reed-Solomon Decoders," IEEE Transactions on Very Large Scale Integration (VLSI) Systems, vol. 9, No. 5, Oct. 2001, pp. 641-655.
Toshio Horiguchi, "High-Speed Decoding of BCH Codes Using a New Error-Evaluation Algorithm," Electronics and Communications in Japan, Part 3, vol. 72, No. 12, 1989, pp. 63-71.

* cited by examiner

*Primary Examiner* — M. Mujtaba K Chaudry
(74) *Attorney, Agent, or Firm* — Steven J. Cahill

(57) ABSTRACT

Systems and methods are provided for performing error correction decoding. The coefficients of the error locator polynomial are iteratively determined for each codeword using a modular implementation of a single recursion key-equation solver algorithm. According to this implementation, modules are used to calculate the current and previous coefficients of the error locator polynomial. One module is used for each correctable error. The modular single recursion implementation is programmable, because the number of modules can be easily changed to correct any number of correctable errors. Galois field tower arithmetic can be used to calculate the inverse of an error term. Galois field tower arithmetic greatly reduces the size of the inversion unit. The latency time can be reduced by placing the computations of the inverse error term outside the critical path of the error locator polynomial algorithm.

20 Claims, 5 Drawing Sheets

DECODING ERROR CORRECTION CODES USING A MODULAR SINGLE RECURSION IMPLEMENTATION

CROSS REFERENCE TO RELATED APPLICATIONS

This application is a divisional of U.S. patent application Ser. No. 11/207,474, filed Aug. 18, 2005, which is incorporated by reference herein in its entirety. This application is related to commonly-assigned U.S. patent application Ser. No. 11/058,596, filed Feb. 14, 2005, which is incorporated by reference herein in its entirety.

BACKGROUND OF THE INVENTION

1. Field of the Invention

The present invention relates to techniques for performing error correction in data recording systems, and more particularly, to techniques for performing error correction with a decoder that uses a modular single recursion implementation.

2. Related Art

Errors in digital data can occur upon reading digital data stored on a data disk. Disk drives typically have error correction encoders and decoders that are used to detect and correct data errors. Error correction and detection can be performed using a Reed-Solomon (RS) code.

For each data symbol (byte), an RS encoder generates error correction check bytes. The check bytes are appending to the symbol to generate RS codewords, where N is number of symbols in each codeword. The RS codewords are then stored in memory (such as a magnetic hard disk) or transmitted over a communication channel.

After data is read from the memory, an RS decoder decodes the RS codewords to correct any errors. An RS decoder includes a syndrome computation block, a key-equation solver (KES) block, and a Chien search and error evaluator (CSEE) block. The syndrome computation block computes the syndromes, which are viewed as coefficients of a syndrome polynomial $S(x)$. The syndromes are passed to the KES block.

If there are any non-zero syndromes, it is assumed that there is an error. The KES block solves equation (1) to determine the error locator polynomial $V(x)$ and the error evaluator polynomial $Q(x)$, where t is the number of errors that the RS code can correct.

$$V(x)S(x) \equiv Q(x) \bmod x^{2t} \quad (1)$$

The error locator and error evaluator polynomials are then passed to the CSEE block. The CSEE block calculates the error locations and the error values. The decoder can find the error locations by checking whether $V(a^{-j})=0$ for each j, $0 \leq j \leq t-1$. This process is called a Chien search. If $V(a^{-j})=0$, then each $a^j$ is one of the error locations. Each of the roots $a^{-j}$ of the error locator polynomial $V(x)$ is the reciprocal of an error location. The error values $e_i$ are calculated using Forney's error value formula (2).

$$e_i = \frac{Q(x)}{V'(x)}\bigg|_{x=a^{-j_i}} \quad (2)$$

In equation (2), $V'(x)$ denotes the formal derivative of the error locator polynomial $V(x)$. The CSEE block corrects the errors in the received word as it is being read out of the decoder by subtracting the error values $e_i$ from symbols at the found error locations in the received codeword.

The latency throughput bottleneck in RS decoders is in the KES block which solves equation (1). Typically, the critical path delay of the KES block determines the latency throughput of the decoder.

An Euclidean algorithm is an iterative approach for solving equation (1). For each successive value, the Euclidean algorithm iteratively determines the next error locator polynomial coefficients using the current and the previous error locator polynomial coefficients. The Euclidean algorithm also iteratively determines the next error evaluator polynomial coefficients using the current and the previous error evaluator polynomial coefficients.

Thus, the Euclidean algorithm performs two 2-term recursions to calculate the error locations and the error values. If each iteration is completed in one clock cycle, then as many as 2t clock cycles are needed to find the coefficients of the error-locator and error-evaluator polynomials. Because the syndrome polynomial $S(x)$ has a degree 2t−1, and the other polynomials can have degrees as large as t, the algorithm needs to store roughly 6t field elements. As the latency of a sequential implementation is $t^2$ cycles, which may be prohibitive, a parallel implementation, using 2t multipliers, is generally required.

It would however be desirable to provide techniques for decoding Reed-Solomon codewords that require less storage space and that achieve the parallel implementation latency using less multipliers.

BRIEF SUMMARY OF THE INVENTION

The present invention provides systems and methods for performing more efficient error correction decoding techniques. Only the coefficients of the error locator polynomial are iteratively determined for each codeword using a modular single recursion implementation of a key-equation solver algorithm. According to this technique, modules are used to calculate the current and previous coefficients of the error locator polynomial. One module with a single multiplier is used for each correctable error. The modular single recursion implementation is programmable, because the number of modules can be easily changed to correct any number of correctable errors.

According to another embodiment of the present invention, Galois field tower arithmetic is used to calculate the inverse of an error term. Galois field tower arithmetic greatly reduces the size of the inversion unit. Also, the latency time can be reduced by placing the computation of the inverse error term outside the critical path of the error locator polynomial algorithm.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1A:
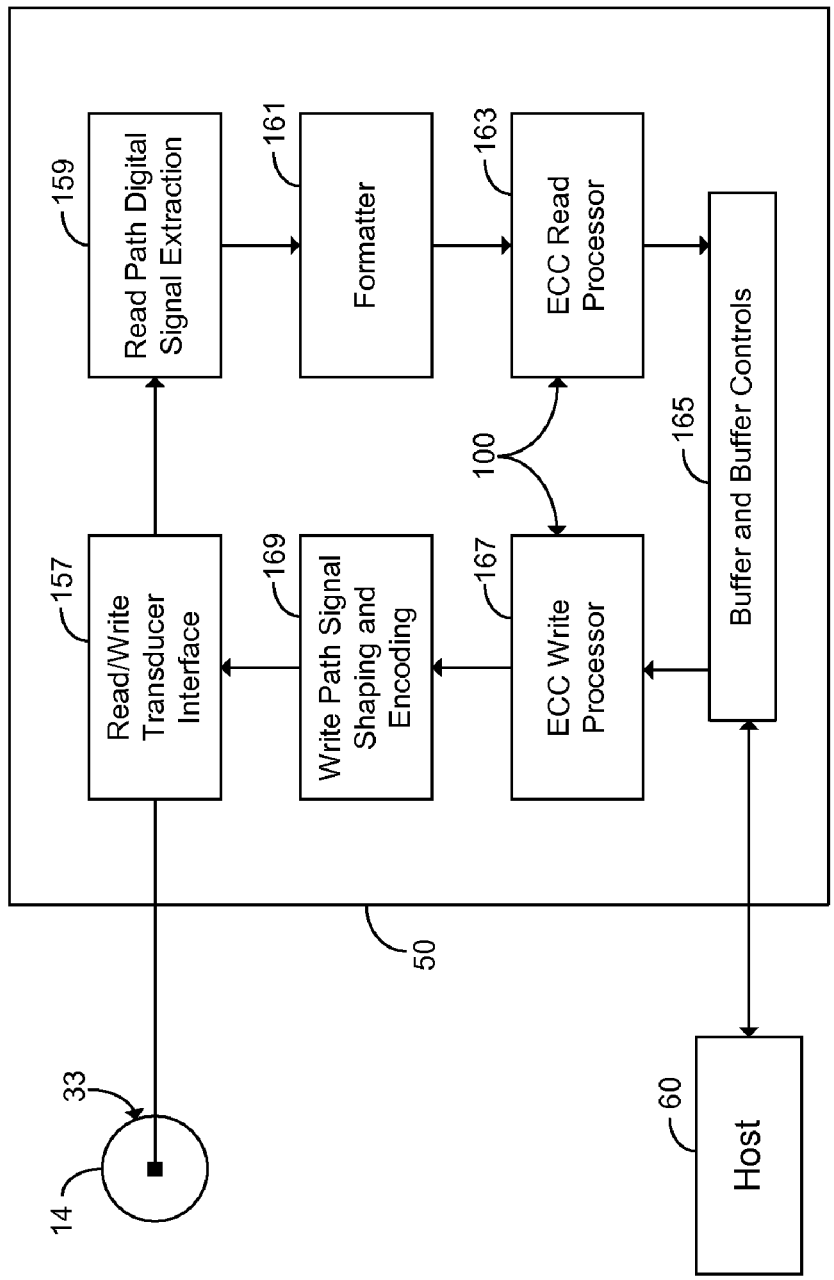
FIG. 1A is a block diagram of a data storage system depicting data flow along a read channel and a write channel of the hard disk drive controller of FIG. 1B.
Figure 1B:
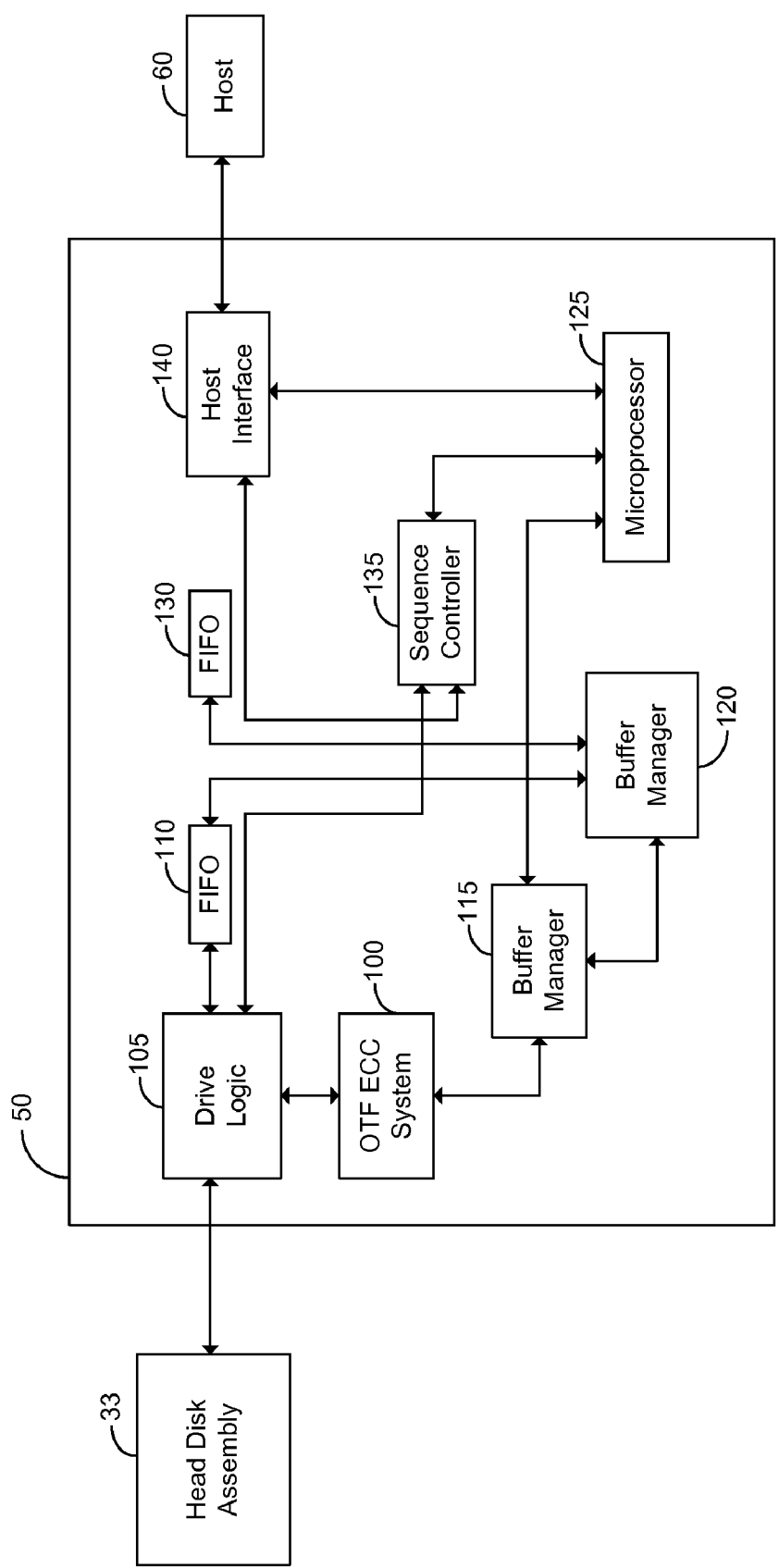
FIG. 1B is a block diagram detailing the architecture of a buffered hard disk drive controller that includes an on-the-fly error correction code (ECC) system for implementing on-the-fly error correction code.

FIGS. 1A and 1B illustrate an example of a hard disk drive control system for reading and writing data onto a magnetic hard disk. FIG. 1A is a block diagram of a data storage system, and FIG. 1B is a block diagram showing the architecture of a hard disk controller. The hard disk drive control system of FIGS. 1A-1B is an example of hard disk drive system that can implement techniques of the present invention. The hard disk drive system of FIGS. 1A-1B can detect and correct errors in the data read from a disk.

FIG. 1B illustrates an exemplary architecture of a buffered hard disk drive controller 50. Hard disk drive controller 50 is configured to read data from and write data to a magnetic hard disk 14 shown in FIG. 1A. Controller 50 includes an on-the-fly error correction code (ECC) system 100 for implementing an on-the-fly error correction code.

On-the-fly error correction code system 100 includes an ECC read processor 163 and an ECC write processor 167 as shown in FIG. 1A. When sequences of digital binary data are to be written onto the disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from hard disk assembly 33, for example from 8 bits to 32 bits. A disk assembly 33 is comprised of disk 14 and a head stack assembly including a spindle motor. A FIFO register 110 stores the formatted data and exchanges the same with a sector buffer 120. The ECC system 100 receives the formatted data from the drive logic circuit 105 and performs an error correction coding algorithm. ECC system 100 can also perform the techniques and processes of the present invention, which are discussed in detail below.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

First, a predetermined number of binary data elements, also termed bytes, in a data string are moved from the buffer 165 and streamed through an ECC write processor 167. In the ECC write processor 167, the data bytes are mapped into codewords drawn from a suitable linear block or cyclic code such as a Reed-Solomon code. Next, each codeword is mapped in a write path signal-shaping unit 169 into a run length limited or other bandpass or spectral-shaping code and changed into a time-varying signal. The time-varying signal is applied through an interface read/write transducer interface 157 and then to the write element in a magneto resistive (or other suitable transducer head) for conversion into magnetic flux patterns.

All of the measures starting from the movement of the binary data elements from buffer 165 until the magnetic flux patterns are written on a selected disk track as the rotating disk 14 passes under the read/write head are synchronous and streamed. For purposes of efficient data transfer, the data is de-staged (written out) or staged (read) a codeword at a time.

Thus, both the mapping of binary data into Reed-Solomon codewords and the conversion to flux producing time-varying signals must be done well within the time interval defining a unit of recording track length moving under the transducer. Typical units of recording track length are equal fixed-length byte codewords of 512 bytes.

When sequences of magnetic flux patterns are to be read from the disk 14, they are processed in a read path or channel (157, 159, 161, and 163) and written into the buffer 165. The time-varying signals sensed by a transducer are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 161.

Because the read path is evaluating sequences of Reed-Solomon codewords previously recorded on the disk 14, absent error or erasure, the codewords should be the same. In order to test whether that is the case, each codeword is applied to an RS decoder in ECC read processor 163 over a path from formatter 161.

The output from the ECC processor 163 is written into buffer 165. The read path also operates in a synchronous data-streaming manner such that any detected errors must be located and corrected within the codeword well in time for the ECC read processor 163 to receive the next codeword read from the disk track. The buffer 165 and the read and write channels may be monitored and controlled by the microprocessor 125 to ensure efficacy where patterns of referencing may dictate that a path not be taken down, such as sequential read referencing.

The present invention provides systems and methods for determining error locations and error values for errors in codewords read from a memory device or transmitted along a communication channel. The present invention receives syndromes for each codeword from a syndrome calculation unit. The error locations $l_i$ and error values $e_i$ can be determined from the syndrome values using the following formulas (3) and (4), where N is the number of bytes per codeword.

$$l_i : v(a^{l_i}) = 0, l_i \in [1, \ldots, N], i = 1, \ldots, t \quad (3)$$

$$e_i = \frac{1}{u(l_i)v'(l^i)}, i = 1, \ldots, t \quad (4)$$

Equation (3) is used to compute the roots of the error locator polynomial v(x). The roots of error locator polynomial are used to determine the error locations $l_i$. The error values $e_i$ are computed by multiplying the previous error locator polynomial $u(l_i)$ by the derivative of the current error locator polynomial $v'(l_i)$ for each error location $l_i$, and then inverting the result, as shown in equation (4).

The coefficients for the error locator polynomials u(x) and v(x) can be computed using an iterative process that is described in detail below with respect to FIGS. 2 and 3. Using equation (4), the error values $e_i$ can be calculated without having to perform the recursion required to determine the coefficients of the error evaluator polynomial. This technique is referred to as a single recursion key-equation solver (KES) algorithm.

The present invention only requires 2t registers to store 2t syndromes and 2t registers (registers u and v) to store 2t coefficients of the error locator polynomials, where t is the number of correctable errors. This technique eliminates the need to store the 2t coefficients of the error evaluator polynomials. Thus, the present invention requires only 4t registers to store the values needed to compute the error values, which is 2t registers less storage than required by the Euclidean algorithm.

According to a modular embodiment of the present invention, identical modules are used to calculate the error locator polynomial coefficients. One module is used for each correctable error. Thus, if t is the number of correctable errors, t modules are used.

Each module has two symbol registers $v_i$ and $u_i$ for storing the current and previous coefficients of the error locator polynomial, respectively. Each module also includes one multiplier, which is used to compute equations (5) and (6) described below. Because there is 1 multiplier in each of the t modules that performs 2 multiplications and 2 iterations, the present invention has a minimum latency of 4t. The Euclidean algorithm requires 2t multipliers to achieve a similar latency.

The modular implementation of the present invention is programmable, because the number of modules can be changed, thus changing the number t of correctable errors. The modular architecture of the present invention can perform error correcting on 10-bit and 12-bit ECC codes within the same piece of hardware, at a minimal hardware increment (about 7-8 Kgates). Thus, 512-byte, as well as 4K-Block capabilities, can be combined in the same hard disk drive.

Figure 2:
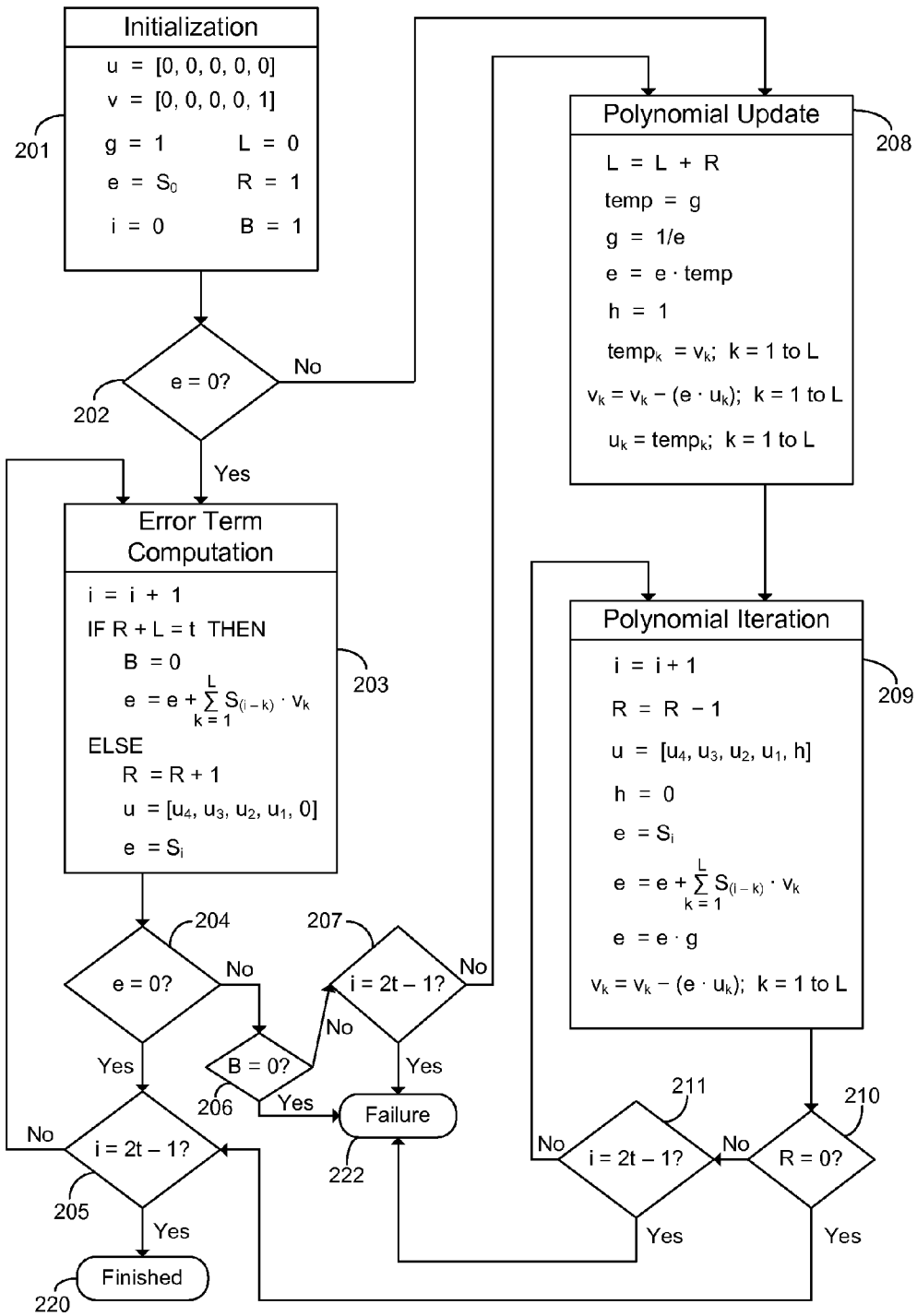
FIG. 2 is a flow chart that illustrates an algorithmic process for determining the error locator polynomial coefficients using a single recursion computation according to an embodiment of the present invention.

An example of a process for determining the error locator polynomial coefficients is shown in FIG. 2. Initialization of the variables is performed in step 201. At step 201, register u $[u_5, u_4, u_3, u_2, u_1]$ is initialized to [0,0,0,0,0] and register v $[v_5, v_4, v_3, v_2, v_1]$ is initialized to [0,0,0,0,1]. It should be understood that registers u and v can store any desired of number of symbols. Five symbols per register is merely used as an example to illustrate the principles of the present invention. An error discrepancy term e (also referred to as the error term) is initially set to the first syndrome value $S_0$.

The process of FIG. 2 uses three counters. An iteration counter i counts the number of iterations that vary from 0 to 2t. The iteration counter i is initially set to 0. An error locator degree counter L counts the degree of the polynomial being calculated. The error locator degree counter is initialized to 0 at step 201. An error term counter R counts the number of error term e calculations. The error term counter R is initially set to 1. Other variables g and B are also set to 1.

At decisional step 202, the value of the error term e is checked to determine if it equals 0. If the error term e (i.e., the first syndrome value $S_0$)≠0, the process moves to polynomial update step 208, which is described below. If e=0, the process proceeds to error term computation step 203. In step 203, counter i is incremented. Then, if R+L=t, B is set to 0, and a computation is performed to determine the error term e using equation (5).

$$e = e + \sum_{k=1}^{L} S_{(i-k)} \cdot v_k \quad (5)$$

The value of L could be as high as t during iterations of FIG. 2. If t adders are used to implement equation (5), then t additions are performed to compute error discrepancy term e. The additions can be parallelized and only $\log_2 t$ additions need to be performed to compute error term e. If $\log_2 t$ additions are performed in equation (5), then the error term e can be computed in a single clock cycle.

Each module has one multiplier. The t multipliers in the t modules are used to perform the multiplications of equation (5). Further details of these multiplications are described below with respect to FIG. 4. One multiplication is performed in each iteration of step 203.

If R+L≠t, then R is incremented by one. Also, the coefficients stored in register u are shifted left, and the first value of the u register is set to 0, such that the u register stores values $[u_4, u_3, u_2, u_1, 0]$. Also, the error term e is set to the next syndrome value $S_i$. If error term e=0 at decisional step 204, and counter i=2t−1, the process is finished at step 220.

Equation (3) above is solved to determine the error locations $l_i$ using the values of the error locator polynomial coefficients that are stored in register v at step 220. The derivative of the error locator polynomial is then computed using the coefficients values stored in register v at step 220. The derivative of the error locator polynomial and the previous values of the error locator polynomial coefficients stored in register u at step 220 are then plugged into equation (4) to calculate the error values $e_i$.

If counter i≠2t−1 at decisional step 205, error term computation step 203 is repeated to calculate the error term e for the next error. If error term e≠0 at decisional step 204, and B=0 at decisional step 206, the process fails at step 222, because it determines that the error is not correctable. If error term e≠0 at decisional step 204, B≠0 at decisional step 206, and i=2t−1 at decisional step 207, the process also fails at step 222, because the error is not correctable.

If however, error term e≠0 at decisional step 204, B≠0 at decisional step 206, and i≠2t−1 at decisional step 207, the process proceeds to polynomial update step 208. At step 208, the error locator degree counter L is incremented by L=L+R and a temp register variable is set to g. The stored variable value g is then set to the inverse of the error term e. The inverse of the error term e can be calculated using Galois field tower arithmetic. Galois field tower arithmetic is described in commonly assigned, co-pending U.S. patent application Ser. No. 11/058,596, filed Feb. 14, 2005, which is incorporated by reference herein.

The algorithm of FIG. 2 is structured to optimize the critical path latency. For example, the computation of the inverse of the error term e can typically be performed in two clock cycles using tower arithmetic. Also, the latency time of the algorithm is reduced by placing the computations of the inverse error term g outside the critical path of the algorithm through step 203.

Galois field tower arithmetic also significantly reduces the size of the inversion unit. For example, for 12-bit Galois field arithmetic, a table of 6-by-$2^6$−1 bits can be used, instead of a table of 12-by-$2^{12}$−1 bits. This represents a reduction in the storage space requirements by a factor of 130 by using Galois field tower arithmetic. A reduction can also be achieved for log and antilog tables from 10-by-$2^{10}$−1 bits to 5-by-$2^5$−1 bits each using Galois field tower arithmetic.

Returning to step 208, the error term e is assigned to the current value of the error term e times the temp variable (e·temp), and a new h variable is assigned to 1. An array of $temp_k$ variables having k values is then assigned to each k value stored in the v register, where k equals 1 to L. The values of the v register are then updated to the new error locator polynomial coefficients using the error term e and current and previous coefficients of the error locator polynomial, as shown in equation (6).

$$v_k = v_k - (e \cdot u_k); \text{ for } k=1 \text{ to } L \qquad (6)$$

Next, register u is updated to the previous error locator polynomial coefficients by assigning each k value of register u to the corresponding k values of $temp_k$ to complete step 208.

The latency time for step 208 is based on two multiplications and one addition. One multiplication and one addition are performed to implement equation (6), and one additional multiplication is performed for extemp. The two multiplications and one addition can be performed in one clock cycle.

Subsequently, the process moves on to step 209. In step 209, the iteration counter i is incremented by 1, and the error term counter R is decreased by one. Also, the coefficients stored in the u register are shifted left, and the first value in the u register is set to h so that the u register stores $[u_4, u_3, u_2, u_1, h]$. Then, h is set to 0, and the error term e is set to the next syndrome value $S_i$ in each clock cycle. The error term e is then computed for the next error by applying equation (5) above.

The error term e is assigned to the result of equation (5) times the inverse of a previous value of error term e (e=e·g). Next, the values stored in register v are updated to the new error locator polynomial coefficient values as shown in equation (6) using the current value of the error term and the current and previous coefficients of the error locator polynomials.

The process then moves to decisional step 210. If the value of the error term counter R is equal to zero at step 210, and the iteration counter i equals 2t−1 at step 205, the process finishes at step 220. The error locations $l_i$ and error values $e_i$ are then computed using the values stored in registers v and u and equations (3) and (4) as described above. If R=0 at step 210, but i≠2t−1 at step 205, error term computation step 203 is repeated. If R≠0 at step 210, and i≠2t−1 at decisional step 211, then polynomial step 209 is repeated.

Each time step 209 is repeated, the counter i increases by 1, counter R decreases by 1, error term e is recomputed, register v is updated, and the contents of register u are shifted. Step 209 is repeated until R=0. If R=0 and i=2t−1 after step 209, then the process fails at step 222 due to an uncorrectable error.

The process illustrated in FIG. 2 can be implemented by a finite state machine (FSM) according to another embodiment of the present invention. FIG. 3 illustrates an example of a FSM according to the present invention. Table 1 below illustrates the values for the control signal vectors A-O that control the KES algorithm state of the FSM, in which φ represents a don't care state.

TABLE 1

| KES Algorithm State | Control Signal Vector |
| --- | --- |
| A | [φ, 0, 0, 0, 0, 0, 0, 0, φ, φ, 0, 0, 0, 0, 0, 0, 0] |
| B | [1, 1, 1, 1, 1, 0, 0, 0, φ, φ, 0, 0, 0, 0, 0, 0, 0] |
| C | [0, 1, 0, 0, 1, 1, 0, 1, 1, 0, 1, 0, 1, 0, 0, 0, 0] |
| D | [0, 0, 0, 1, 1, 0, 0, 1, 0, 0, 0, 1, 0, 0, 1, 0, 0, 0] |
| E | [0, 0, 0, 0, 0, 0, 0, 1, φ, φ, 0, 0, 0, 0, 0, 0, 0] |
| F | [0, 1, 0, 0, 1, 1, 1, 0, 1, 0, 0, 0, 0, 1, 0, 1, 0, 0] |
| G | [0, 0, 0, 0, 1, 0, 0, 0, 0, 0, 1, 0, 0, 0, 0, 0, 0] |
| H | [0, 0, 0, 0, 1, 0, 0, 0, 0, 1, 0, 0, 0, 0, 0, 0, 0] |
| I | [0, 0, 0, 0, 0, 0, 0, 0, φ, φ, 0, 0, 0, 0, 0, 1, 0] |
| L | [0, 1, 0, 0, 0, 1, 0, 0, 0, 0, 1, 0, 0, 0, 0, 0, 0] |
| M | [0, 0, 0, 1, 0, 0, 0, 0, 1, 0, 0, 0, 0, 1, 0, 0, 0, 0] |
| N | [0, 1, 0, 0, 0, 0, 0, 0, 0, 0, 1, 0, 0, 0, 0, 0, 0] |
| O | [0, 0, 0, 0, 0, 0, 0, 0, φ, φ, 0, 0, 0, 0, 0, 0, 1] |

The states of the FSM can be stored in registers. Because there are 13 states in the example FSM shown in FIG. 3, at least 4 bits are needed to have unique register values for each state. In the following example, 5 bits are used. Example register values that can indicate the 13 unique states are now provided as illustrations. Idle state A=[00000], initialization state B=[00001], error term computation state C=[00010], error term computation without u-shift L=[01011], shift back u register M=[01100], polynomial update=[00011], polynomial iteration E=[00100], polynomial iteration F=[00101], polynomial iteration G=[00110], finished state I=[01000], scales U state H=[00111], failure state O=[01110], and polynomial update and iteration state N=[01101].

Figure 3:
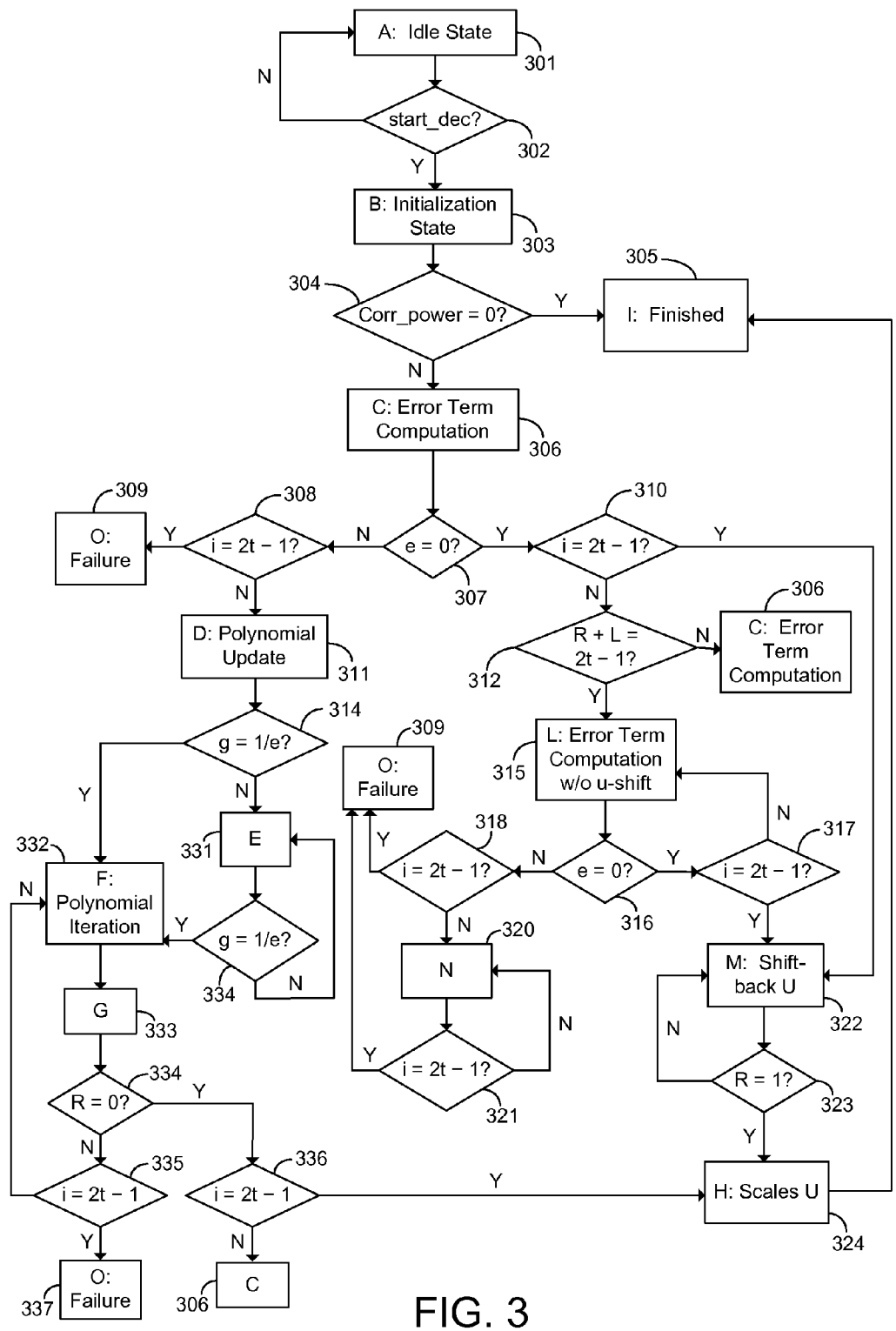
FIG. 3 illustrates a finite state machine that implements the algorithm for determining the error locator polynomial coefficients using a single recursion computation according to an embodiment of the present invention.

Referring to FIG. 3, the idle state A/301 is the first state that occurs in the FSM. At decisional step 302, the FSM checks the value of a start-dec variable to determine whether to remain in the idle state or to proceed to initialization state B/303. The FSM will remain in the idle state as long as the start-dec variable indicates that it should do so. In initialization state 303, the variables and registers are initialized as described above with respect to step 201.

After the initialization state B, the FSM checks if a corr-power variable equals 0 at decisional step 304. The corr-power variable stores the correction power, which indicates the number of errors that need to be corrected. If corr-power=0, the FSM enters finished state I 305, because there are no errors that need to be corrected.

If corr-power≠0, the FSM enters the error term computation state C/306. In error term computation state C/306, the computations described above with respect to step 203 are performed. An error term e value is computed using equation (5). The FSM then determines if the new error term e equals zero after state C at decisional step 307.

If the error term e=0 at step 307, i≠2t−1 at decisional step 310, and R+L=2t−1 at decisional step 312, the computations of step 203 are repeated at state L/315. A new error term e is computed by substituting the current value of the error term e into equation (5). The error term e is continually updated at state L/315 as long as e=0 at decisional step 316 and i≠2t−1 at decisional step 317. If R+L≠2t−1, the FSM returns to state C/306. After state 306, the FSM returns to decisional step 307 to determine if e=0.

If e≠0 at step 316 and i=2t−1 at step 318, the FSM enters failure state O/309 due to an uncorrectable error. If i≠2t−1 at step 318, the FSM enters state N/320. In state N/320, steps 208 and 209 described above with respect to FIG. 2 are performed. In state N, the error term is inverted, new values $v_i$ for the error locator polynomial coefficients are computed using equation (6), the previous error locator polynomial $u_i$ is updated, and a new value for the error term e is computed using equation (5). If i≠2t−1 at decisional step 321, state N is repeated, and continues to repeat until i=2t−1, at which point the FSM enters failure state O/309.

If i=2t−1 at step 317, the FSM enter shift back U state M/322. In state M/322, the values stored in the u register are shifted if R+1≠t, as described above with respect to step 203. State M/322 is repeated until R=1 at step 323. When R=1 at step 323, the FSM enters state scales U/324. In state U/324, the coefficients stored in register u are scaled using equation (6) as described above with respect to step 209. The FSM then enters finished state I/305.

If e≠0 at step 307 and i=2t−1 at step 308, the FSM enters failure state 309 due to an uncorrectable error. If i≠2t−1 at step 308, the FSM enters polynomial update state D/311. In state D/311, the FSM performs the computations described above with respect to step 208 in FIG. 2.

At decisional step 314, variable g is checked to determine if g=1/e. If g≠1/e at step 314, the inversion of the error term has failed, and the FSM enters state E/331 to recalculate the inverse of the error term e. If g=1/e at decisional steps 314 or 334, the FSM enters polynomial iteration state F/332 and then state G/333. Otherwise, the inverse of the error term e is recalculated at state E/331.

In states F/332 and G/333, the FSM performs the computations described above with respect to step 209 in FIG. 2. If R≠0 at decisional step 334 and i≠2t−1 at decisional step 335, the FSM returns to state F/332 to repeat the next polynomial iteration. If R≠0 at step 334 and i=2t−1 at step 335, the FSM enters failure state O/337 due to the detection of an uncorrectable error. If R=0 at step 334 and i≠2t−1 at decisional step 336, the FSM returns to error term computation state C/306 and then to step 307, as described above. If R=0 at step 334 and i=2t−1 at step 336, the FSM moves to scales U state H/324 and then to finished state I/305.

Figure 4:
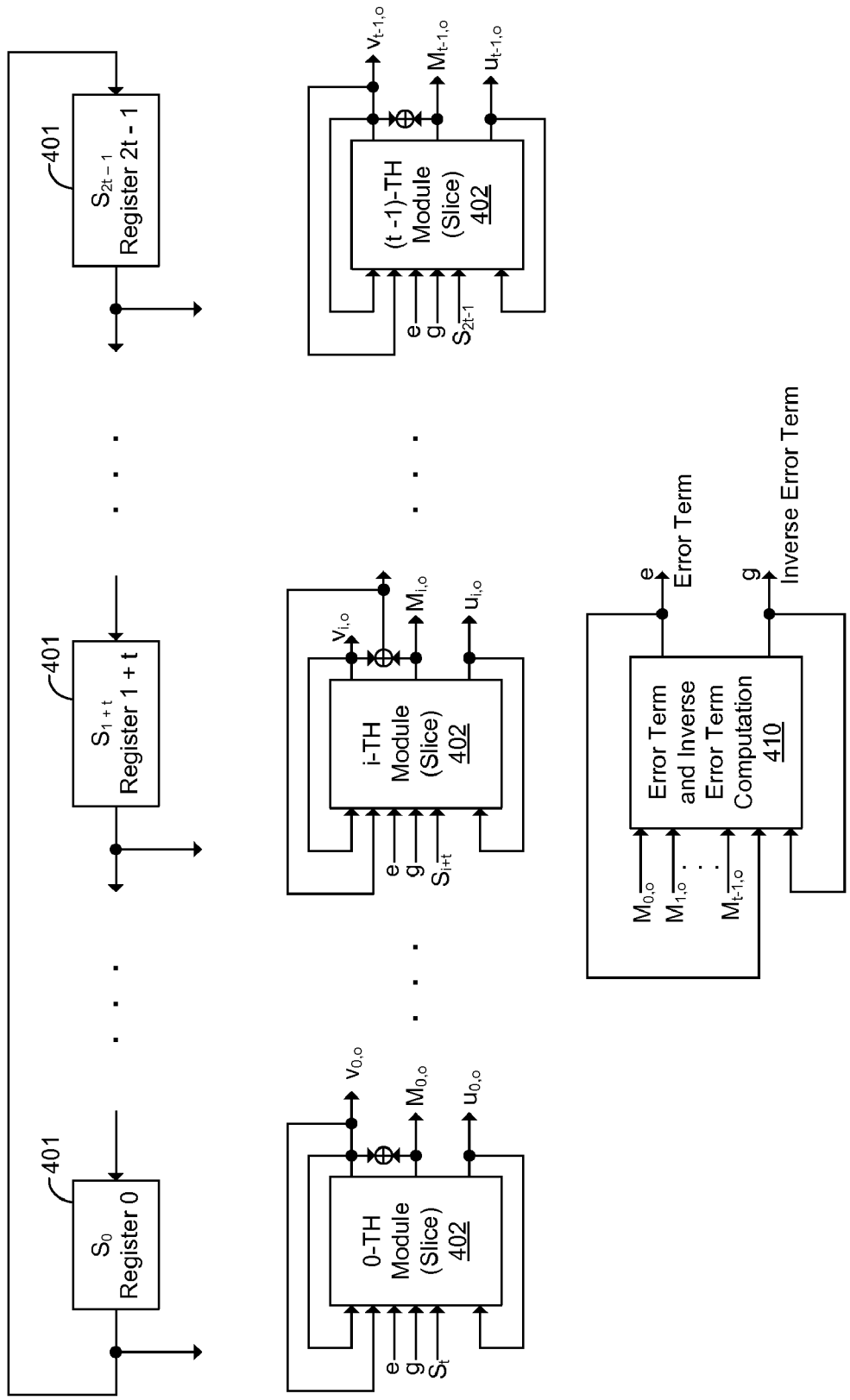
FIG. 4 illustrates a diagram of a modular implementation of a single recursion algorithm for calculating error locator polynomial coefficients according to an embodiment of the present invention.

FIG. 4 illustrates a diagram of a modular single recursion system for calculating error values according to an embodiment of the present invention. In a system that can correct as many as t correctable errors, the system of FIG. 4 includes 2t registers 401, t modules 402, and one error term and inverse error term computation block 410.

2t syndrome values are stored in circular shift registers 401. The syndrome values $S_0, \ldots, S_{1+i}, \ldots, S_{2t-1}$ are circularly shifted through registers 401. Each time the i counter is incremented by one, the syndromes $S_i$ are shifted left to the next register 401, except that the syndrome in the leftmost register 0 is shifted to the rightmost register 2t−1. The syndromes are provided to modules 402, along with the current values for the error term e and the inverse error term g.

Each of the t modules 402 contains two registers u and v and one multiplier. The t modules 402 are labeled 0–(t−1) in FIG. 4. The t modules 402 compute the updated error locator polynomial coefficients $[v_{t-1}, \ldots, v_0]$ for each of the t correctable errors in each iteration of step 209 using equation (6). The t modules 402 also compute the previous error locator polynomial coefficients $[u_{t-1}, \ldots, u_0]$ in each iteration of step 209 as described above.

The multiplier in each module performs the multiplications $M_{i,o} = S_{i+t} \cdot V_i$, where i=0, …, t−1. The results $\{M_{i,o}\}_{i=0}^{t-1}$ are provided to the error term and its inverse computation in block 410.

Block 410 includes a set of adders that sum $\{M_{i,o}\}_{i=0}^{t-1}$ together and add the result to the current value of the error term e, per equation (5). In step 209, the result of those additions is multiplied by the inverse g of the error term to generate a new value for e. Block 410 applies Galois field tower arithmetic to the error term e to compute the inverse value g. The values of e and g computed in block 410 are transmitted back to modules 402 for use in the next polynomial iteration.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. An apparatus for correcting errors in data, the apparatus comprising:
   syndrome registers for storing syndromes; and
   modules that receive the syndromes from the syndrome registers, each of the modules comprising first and second registers and a multiplier,
   wherein each of the modules computes current and previous coefficients of an error locator polynomial using a single recursion key-equation solver algorithm, stores the current coefficient of the error locator polynomial in the first register, and stores the previous coefficient of the error locator polynomial in the second register, and
   wherein the multipliers in the modules multiply the syndromes by the current error locator polynomial coefficients.

2. The apparatus defined in claim 1 wherein each of the modules has only one multiplier.

3. The apparatus defined in claim 1 further comprising:
   a computation block that computes an error term and that computes an inverse of the error term using Galois field tower arithmetic.

4. The apparatus defined in claim 3 wherein the computation block computes the error term by summing together a current value of the error term and an output of the multiplier in each of the modules to generate a result, and multiplying the result by the inverse of the error term.

5. The apparatus defined in claim 3 wherein the computation block consists of only t adders that sum together outputs of the multipliers, where t equals a number of correctable errors, and a delay of the t adders is $\log_2 t$.

6. The apparatus defined in claim 3 wherein the current coefficients of the error locator polynomial are generated using an equation $v_k = v_k - (e \cdot u_k)$ for each of the current coefficients $v_k$, wherein e is the error term, and $u_k$ represents the previous coefficient of the error locator polynomial.

7. The apparatus defined in claim 1 wherein error locations and error values are computed using the current and the previous coefficients of the error locator polynomial computed by the modules, without using coefficients of an error evaluator polynomial.

8. The apparatus defined in claim 1 wherein the apparatus is a data storage device.

9. The apparatus defined in claim 1 wherein the computations of the current and the previous coefficients of the error locator polynomial in the modules are outside of a critical path of a decoder.

10. The apparatus defined in claim 3 wherein each of the modules computes new values for the current and the previous coefficients of the error locator polynomial in each iteration,
    wherein the syndromes are circularly shifted through the syndrome registers in each iteration, and the computation block computes new values for the error term and the inverse error term in each iteration.

11. A device for correcting errors in data, the device comprising:
    syndrome registers for storing syndromes;
    modules that receive the syndromes from the syndrome registers, each of the modules comprising a multiplier, wherein each of the modules computes current and previous coefficients of an error locator polynomial, and the multipliers in the modules multiply the syndromes by the current error locator polynomial coefficients to generate multiplication results; and a computation block that computes an error term using the multiplication results and that computes an inverse of the error term using Galois field tower arithmetic.

12. The device defined in claim 11 wherein each of the modules computes the current and the previous coefficients of the error locator polynomial using a single recursion key-equation solver algorithm, and the device is a data storage device.

13. The device defined in claim 11 wherein each of the modules further comprises first and second registers, and wherein each of the modules stores the current coefficient of the error locator polynomial in the first register and the previous coefficient of the error locator polynomial in the second register.

14. The device defined in claim 11 wherein each of the modules has only one multiplier.

15. The device defined in claim 11 wherein the computation block computes a new error term value by summing together a current value of the error term and the multiplication results to generate an intermediate result, and multiplying the intermediate result by the inverse of the error term.

16. The device defined in claim 11 wherein the computation block computes the inverse of the error term outside a critical path of an algorithm for the error locator polynomial.

17. A method for correcting errors in data, the method comprising:
    storing syndromes in syndrome registers;
    receiving the syndromes from the syndrome registers in modules;
    computing current and previous coefficients of an error locator polynomial using a single recursion key-equation solver algorithm;
    storing the current coefficient of the error locator polynomial in a first register in each of the modules;
    storing the previous coefficient of the error locator polynomial in a second register in each of the modules; and
    multiplying the syndromes by the current error locator polynomial coefficients.

18. The method defined in claim 17 further comprising:
    computing an error term using results of multiplying the syndromes by the current error locator polynomial coefficients; and
    computing an inverse of the error term using Galois field tower arithmetic.

19. The method defined in claim 18 wherein computing the error term using the results of multiplying the syndromes by the current error locator polynomial coefficients further comprises computing a new error term value by summing together a current value of the error term and the results to generate an intermediate result, and multiplying the intermediate result by the inverse of the error term.

20. The method defined in claim 17 wherein the method for correcting errors in data is performed by a data storage device.

* * * * *